United States Patent
Bradley et al.

(10) Patent No.: US 12,334,802 B1
(45) Date of Patent: Jun. 17, 2025

(54) CIRCUIT AND METHOD OF DRIVING ANALOG LOADS USING DIGITAL SIGNALS

(71) Applicant: ONTURA HOLDINGS, Los Angeles, CA (US)

(72) Inventors: Michael Bradley, Los Angeles, CA (US); Fred Golestani, Scottdale, AZ (US)

(73) Assignee: ONTURA HOLDINGS, Los Angeles, CA (US)

( * ) Notice: Subject to any disclaimer, the term of this patent is extended or adjusted under 35 U.S.C. 154(b) by 0 days.

(21) Appl. No.: 19/051,761

(22) Filed: Feb. 12, 2025

(51) Int. Cl.
  *H02M 1/00* (2007.01)
(52) U.S. Cl.
  CPC ....... *H02M 1/0012* (2021.05); *H02M 1/0006* (2021.05); *H02M 1/0041* (2021.05)
(58) Field of Classification Search
  CPC . H02M 1/0012; H02M 1/0006; H02M 1/0041
  See application file for complete search history.

(56) References Cited

U.S. PATENT DOCUMENTS 10,236,827 B2 * 3/2019 Zhu ................ H03F 1/3264
2024/0429881 A1 * 12/2024 Botti ................ H03F 3/187

\* cited by examiner

*Primary Examiner* — Adolf D Berhane
(74) *Attorney, Agent, or Firm* — INNOVATION CAPITAL LAW GROUP, LLP; Vic Lin

(57) ABSTRACT

A circuit includes a controller. A driving signal source is coupled to the controller. A first digital output line is coupled between the controller and the analog load. The first digital output line is configured to carry a first digital signal. A second digital output line is coupled between the controller and the driving signal source. The second digital output line is configured to carry a second digital signal. The controller is configured to reproduce a target output signal defined by data from the driving source. The reproduced target output signal is generated by controlling a combination of the first digital signal and the second digital signal, as an output in the analog load.

20 Claims, 11 Drawing Sheets

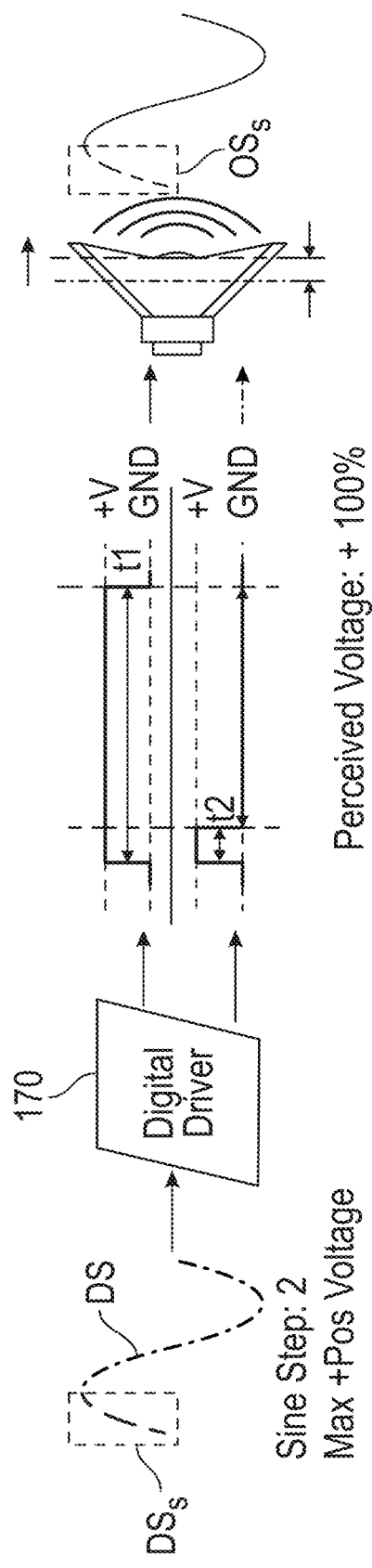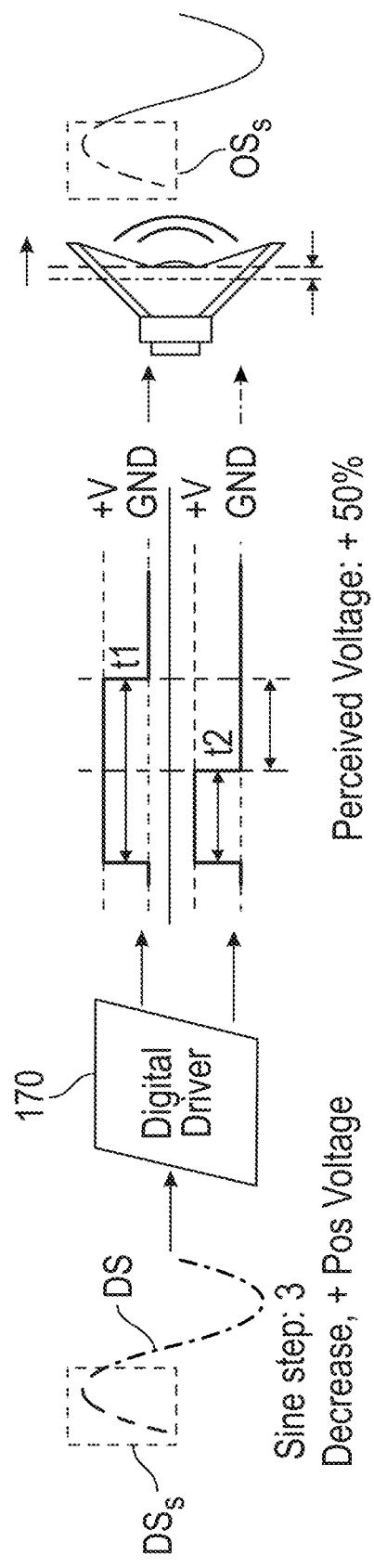

CIRCUIT AND METHOD OF DRIVING ANALOG LOADS USING DIGITAL SIGNALS

FIELD

The subject disclosure relates to electronic circuits, and more particularly, to a circuit and method of driving analog loads using digital signals.

BACKGROUND

Conventionally, to drive an analog load, an analog signal is used. In many common electronic applications, digital sources are preferred because of the cleaner output and other reasons. For example, an audio system commonly has a speaker as the analog load. To drive the speaker, a digital to analog (DAC) module is needed. The DAC is commonly used in most electronic gadgets. DACs convert digital audio information consisting of 0's and 1's into analog audio signals. The audio signals are amplified by the audio equipment to drive headphones (or) loudspeakers (or) music players. This audio conversion process enables audio systems to reproduce accurate and high-quality sound for a better audio experience.

Without the DAC, the speaker would be driven by a pure digital signal. The speaker elements (magnetic coil and cone) would have to move abruptly between high and low signals in short times. Aside from the quality of the output likely being unnatural as compared to an analog signal, the speaker elements may become damaged in short order because of the abrupt forces driving them from being all the way on to all the way off for every change in signal. Thus, it is generally not recommended to drive analog loads with digital signals without the aid of a DAC.

SUMMARY

In one embodiment of the disclosure, a circuit is disclosed. The circuit includes a controller. A driving signal source is coupled to the controller. A first digital output line is coupled between the controller and the analog load. The first digital output line is configured to carry a first digital signal. A second digital output line is coupled between the controller and the driving signal source. The second digital output line is configured to carry a second digital signal. The controller is configured to reproduce a target output signal defined by data from the driving source. The reproduced target output signal is generated by controlling a combination of the first digital signal and the second digital signal, as an output in the analog load.

In another embodiment, a method of driving an analog load is disclosed. The method includes controlling a voltage level of a first digital signal connected to the analog load between an on state and an off state. A voltage level of a second digital signal connected to the analog load is controlled between the on state and the off state. A duration of the first digital signal in the on state is controlled in a reciprocating relationship with a duration of the second digital signal in the on state. Frames of the voltage level of the first digital signal and the voltage level of the second digital signal reproduce a driving signal as output from the analog load.

In yet another embodiment, a method of driving an analog load is disclosed. The method includes receiving a driving signal or file. A first digital signal is generated and sent to the analog load. A second digital signal is generated and sent to the analog load. A ground voltage level is established. The driving signal or file is reproduced as analog output from the analog load by: driving the first digital signal to a voltage state higher than the ground voltage level; driving the second digital signal to the voltage state higher than the ground voltage level; determining by a controller, a voltage level associated with a section of the driving signal or file; and pulling either the first digital signal or the second digital signal to the ground voltage state, for a time frame associated with the section of the driving signal or file.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

FIGS. 5A-5I are a series of illustrative views showing a method of driving an analog load using two digital signal inputs in an offsetting relationship to replicate an analog driving signal, according to an embodiment.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. Like or similar components are labeled with identical element numbers for ease of understanding.

Overview

In general, and referring to the Figures, a circuit 100 and method are disclosed which generates an analog signal output by an analog load by controlling a plurality of digital driving signals to replicate the analog signal from a driving signal or file. In general, two (or more) digital signals are generated. In one embodiment, after a base voltage level is established (for example, ground), the two digital signals are controlled so that either wire carrying the digital signals is energized. One or more of the digital signals are output to the analog load in the high state. To replicate the analog signal in the analog load, for a given time frame, one of the digital signals is dropped to the base voltage level for the duration of the time frame. The perceived voltage that results from the difference in duration of one digital signal being in the high state relative to the duration of the other digital signal being in the high state, drives the analog load with a continuous output that replicates the driving source. It should be appreciated that by controlling the digital signals as disclosed below, embodiments of the subject technology eliminate the need to use a DAC to convert digital signals back to an analog signal for output by analog loads. Analog loads can generate an output with the benefits of digital signals without drawbacks such as damage to the analog load. Moreover, by eliminating the need to include a DAC in an electronic device, the cost of devices drops and they generally become more cost effective to produce.

Device/Circuit

Figure 1:
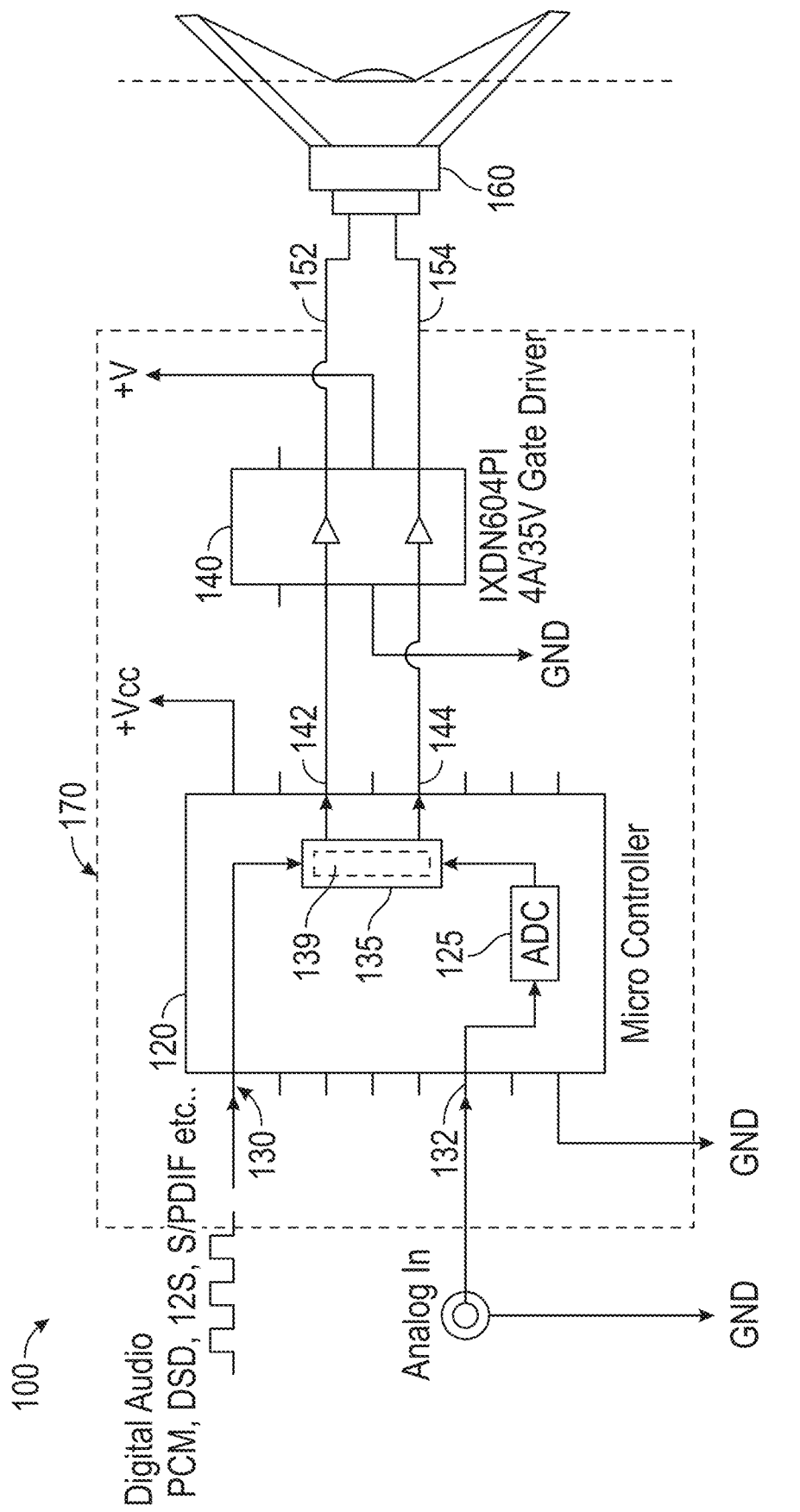
FIG. 1 is a schematic view of a circuit for driving an analog load through digital signals, according to an embodiment.

Referring now to FIG. 1, the circuit 100 is shown according to an embodiment. The circuit 100 includes a controller 120 connected to an analog load 160. For illustrative purposes, embodiments will be described in the context of the analog load 160 being a speaker outputting an audio signal. However, it should be understood that other analog loads may be driven using the same concepts as disclosed below and that the invention is not limited to audio applications. In addition, the circuit 100 may use any type of driving signal from one or more input sources that is converted into digital signals to drive the analog load 160. As can be seen in FIG. 1, embodiments may include an input 130 for digital signals and/or an input 132 for analog signals, which represent the input points for driving sources and their driving signal. As will be understood, the driving source may be data that is other than a signal itself in some cases. For example, the driving source may be a digital file of bytes or code in a format that can be translated/read by the controller 120. The digital file data may represent a desired output signal which will be reproduced by the analog load 160 without the need for a digital to analog converter according to the subject technology. The data from the driving source, when read, may be converted into a combination of digital signals whose simultaneous transmission to the analog load 160 will be perceived as providing a driving voltage that represents a section of the desired signal to be reproduced. The perceived driving voltage at any given frame drives the actuation of the analog load 160 to generate the output signal.

The controller 120 may be a microcontroller, a microchip, computer processor, field-programmable gate array (FPGA), or other processing device. The controller 120 may have output pins 142 and 144 that transmit digital signal commands. The controller 120 may control the high and low state of digital signals sent to the analog load 160. In some embodiments, the controller 120 may include integrated memory 135. The memory 135 may include a set of executable instructions that control the duration output of digital signals, within a time frame, that are sent on output pins 142 and 144 respectively. The executable instructions operate according to the methodology disclosed herein. While the embodiment shows a configuration using only two digital signals, other embodiments may use more than two signals and control the signals' high and low states to replicate the driving signal.

In some embodiments, the controller 120 may be coupled to or may have an integrated analog to digital converter (ADC) 125 that converts analog signals from an analog input pin. The controller 120 may have an input pin that is configured to receive a driving signal or file 130.

In some embodiments, a gate driver 140 may be connected between the controller 120 and the analog load 160. The gate driver 140 provides the current needed by the analog load 160 if the analog load 160 requires more than the initial circuit can provide. As such, the gate driver 140 protects the circuit. The gate driver 140 may have output lines (for example, wires or pin outs) 152 and 154 for respective first and second digital signals.

As will be seen below, the digital signals that are sent along output pins 142 and 144 are transmitted in different combinations of duration in the high state that the analog load 160 will perceive as one voltage level per frame that in effect replicates and analog signal to drive the load. In the embodiments shown below, reference is made to a "digital driver 170". The digital driver 170 may include the elements within the broken line box shown in FIG. 1. However, it will be understood that embodiments do not necessarily include the gating driver 140 if the application does not need to protect the analog load 160 from overdriving damage.

Methodology

Figure 2:
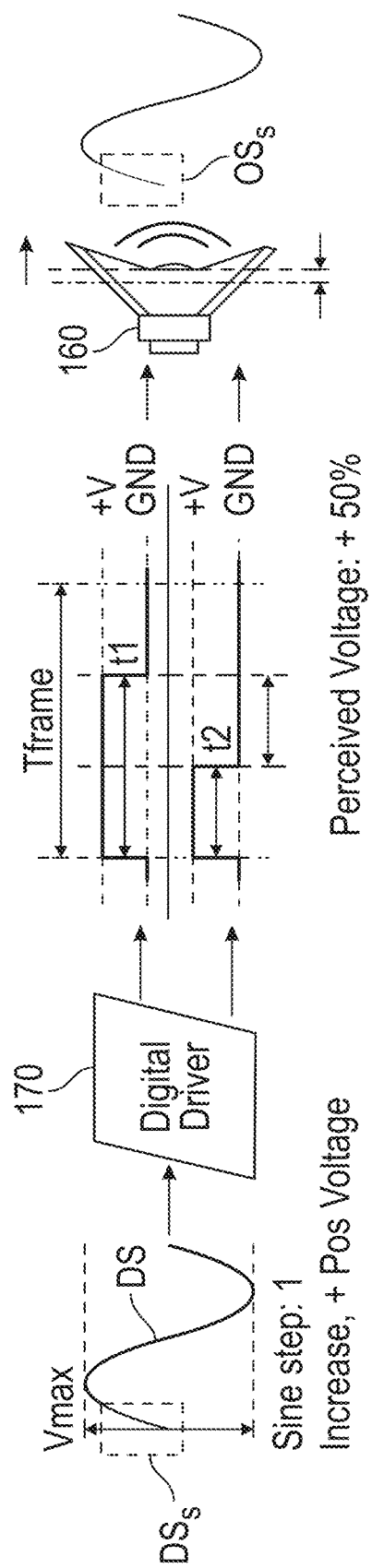
FIG. 2 is a schematic view illustrating perceived voltage of two digital lines driving the analog load of FIG. 1.
Figure 3A:
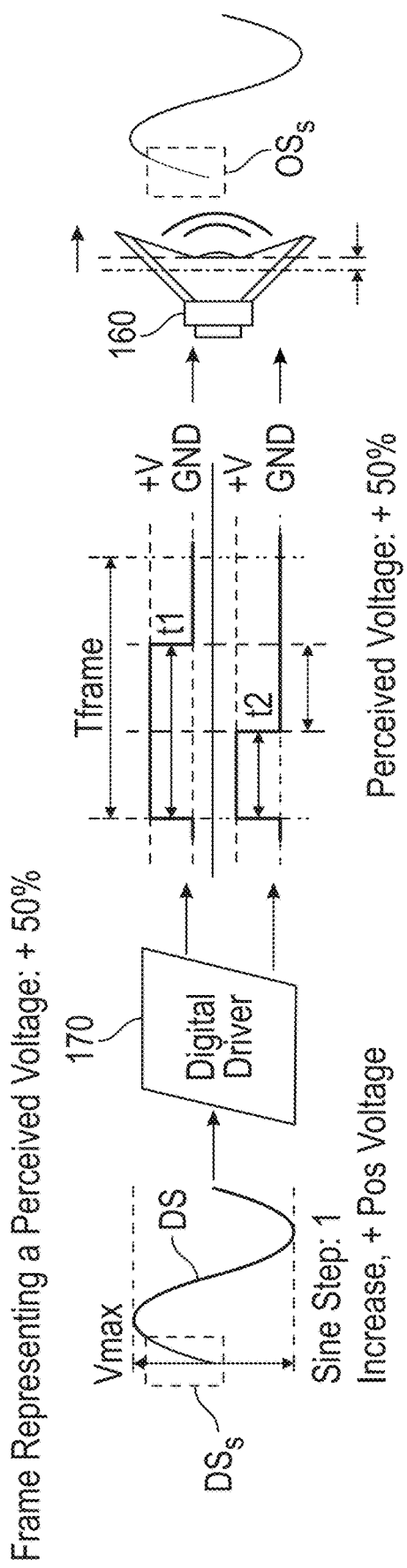
FIG. 3A is a schematic view illustrating a perceived voltage of two digital lines for a positive voltage input of a driving analog signal for the circuit of FIG. 1.

Referring now to FIGS. 2, 3A/3B, 4A/4B, and 5A-5J, an example method of driving an analog load using digital signal is disclosed according to an embodiment. In the description that follows, the two digital signals being generated will be based on a theoretical driving signal DS that represents the desired output for a given time frame (represented by the broken line box $DS_S$) to be generated at the analog load 160 by the data contained in the input source(s). The perceived voltage by the analog load 160 that is based on the combination of duration in the high state for each pair of digital signals within the time frame us represented by the section of actual output signal shown in broken line boxes ($OS_S$) (which stands for Output Signal section).

FIG. 2 shows a general concept where the driving signal DS, represented by the sine wave on the left, is replicated by the output of the digital driver 140. The output of the digital driver 140 produces two (or more) digital signals which are provided to the analog load 160 (by wiring, electrical traces, or wireless signals). When the analog load 160 receives the respective digital signals, the analog load 160 is driven based on the duration of each digital signal in the high state. Depending on whether one digital signal is received for a longer duration than the other digital signal in the high state will determine the magnitude of displacement (if applicable) and frequency of elements being driven in the analog load 160. For example, when the analog load 160 is a speaker, the magnetic coil may be farther away from the default position within the cone (or back toward the default position) depending on whether the digital signal combination is perceived as a positive or negative signal. The distance of displacement for the analog element will be based on the duration of one of the digital signal's time in the high state relative to the other digital signal's duration in the high state. The difference in duration in the high state (i.e., when the digital signal is energized from a base or ground state) will be the perceived voltage that the analog load 160 uses to generate a signal output for the time frame. Each box ($OS_S$) represents that section of the output signal being generated.

In the following description that provides an example of determining characteristics of the subject circuit including for example, quantifying the perceived voltage level from the perspective the of the analog load 160, the following definitions are provided.

Definitions $V_{maxin}$ as referred to herein, is the maximum analog voltage that can be represented.

$V_{analog}$ as referred to herein, is the analog voltage to represent in digital signals.

$V_{rail}$ as referred to herein, is the voltage of the +V power rail used for digital output.

$V_{perceived}$ (also referred to as "Perceived Voltage", as referred to herein, is the voltage level perceived as input by the analog load that is used to drive the output by the analog load.

$F_{rate}$ as referred to herein, is the frame rate frequency (Hz).

$T_{frame}$ as referred to herein, is the time for a frame.

Delta as referred to herein, is the difference between T1 and T2.

$O_a$=Offset A, used to determine ½ Delta for T1.

$O_b$=Offset B, used to determine remaining offset of Delta for T2.

T1=Time for output A to be turned on.

T2=Time for output B to be turned on.

In the example shown in FIG. 2, an analog voltage of 2.5 v ($V_{analog}$) is represented out of a range of −10 v to 10 v to the analog load 160. T1 and T2 are powered on time with a 10 v ($V_{rail}$). $V_{maxin}$=10 v (represents the −10 v to +10 v). $V_{rail}$=10 v. $V_{analog}$=2.5 v. $T_{frame}$=200 KHz.

$$Tframe = \frac{1}{Freq} = 5us \quad (eq) 1$$

$$Delta = \frac{(Vanalog \times Tframe)}{Vmaxin} = 1.25us \quad (eq) 2$$

$$Oa = \frac{Delta}{2} = .625us \quad (eq) 3$$

$$Ob = Delta - Oa = .625us \quad (eq) 4$$

$$T1 = \frac{Tframe}{2} + Oa = 3.125us \quad (eq) 5$$

$$T2 = \frac{Tframe}{2} - Ob = 1.875us \quad (eq) 6$$

Signal A (which would be sent along the line from output pin 142), on time is T1. Signal B (which would be sent along the line from output pin 144) on time is T2.

Perceived Voltage

To determine the voltage perceived by the analog load 160 from the digital signals in the subject circuit, the following equations may be used to calculate what the analog load perceives as a driving voltage for any time frame of input.

Assuming the following measurements from the digital signals:

$T_{frame}$=5 μs (derived from 200 KHz).
$V_{rail}$=10 v.
T1=3.125 μs measured from signal A.
T2=1.875 μs measured from signal B.

$$Vperceived = \frac{T1 - T2}{Tframe} \times Vrail \quad (eq) 7$$

Breakdown of Formula:

$$Vperceived = \frac{3.125 - 1.875}{5} \times 10$$

$$Vperceived = \frac{1.25}{5} \times 10$$

$$Vperceived = .25 \times 10 = 2.5V$$

To measure the signals representing a negative phase:
T1=1.875 us measured from signal A.
T2=3.125 us measured from signal B.
Using (eq) 7 again with the values above:

$$Vperceived = \frac{T1 - T2}{Tframe} \times Vrail \quad (eq) 7$$

$$Vperceived = \frac{1.875 - 3.125}{5} \times 10$$

$$Vperceived = \frac{-1.25}{5} \times 10$$

$$Vperceived = -.25 \times 10 = -2.5V$$

Figure 3B:
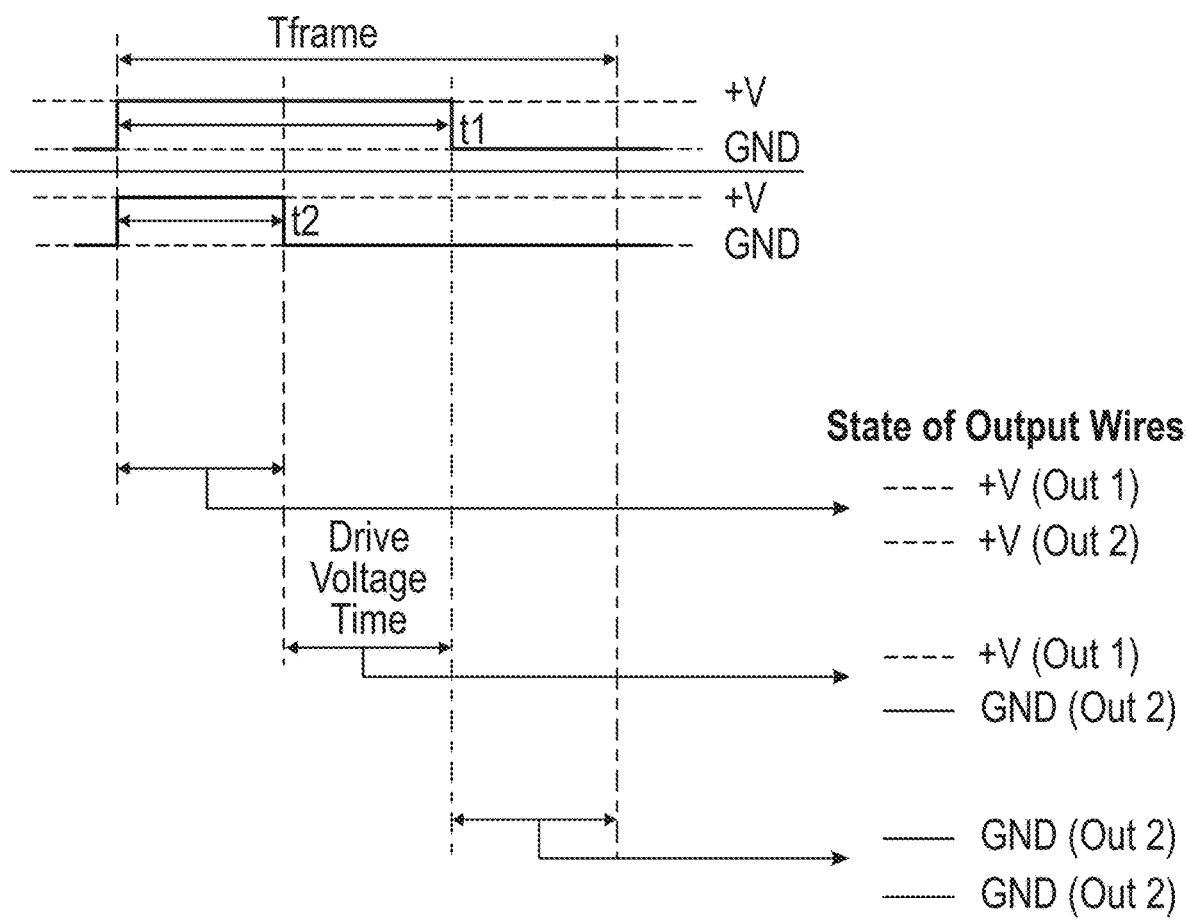
FIG. 3B is an illustrative view showing a state of output lines for the input signal shown in FIG. 3A.

FIGS. 3A and 3B show reproduction of a section of a driving signal. For a given frame of time T, the digital driver 140 may reproduce the section of the driving signal by controlling the high and low states of the digital signals. In the example shown, the driver 140 is replicating a section of the desired output from a driving signal that is increasing from a zero reference level towards a maximum amplitude (represented by the max voltage level). The max voltage level represents the theoretical maximum displacement from the analog load 160. For the section of the driving signal being replicated, the value of the driving signal is positive but less than the maximum. To reproduce the desired section of output signal within the frame T, the driver 140 generates the two digital signals as follows. The duration of the first digital signal in the high or energized state is represented by the duration span t1. The duration of the second digital signal in the high or energized state is represented by the duration span t2. Both output wires on which the first and second digital signals travel may start in the same state. In one embodiment, both signals may start in the high state. Then, one of the digital signals may be dropped to the base state, e.g., ground level. The output wire to the analog load 160 will have output equal to the digital signal that remains in the high state alone and for the time of the remaining pulse. In this instance, the first digital signal will pass through and drive the analog load 160 for a duration equal to the difference of t1 and 2. In the example, shown, to produce a positive perceived voltage, the second digital signal is dropped to ground so that its duration t2 in the high state is less than the duration t1 in the high state for the first digital signal. The perceived voltage in this example is approximately 50% of the maximum possible voltage. After the delta time, the other output wire will change state to match the state of the first signal dropped to the low state; (ground in this example). FIG. 3B shows an enlarged diagram of the relative states of the digital signals and resultant output for the example shown in FIG. 3A.

Figure 4A:
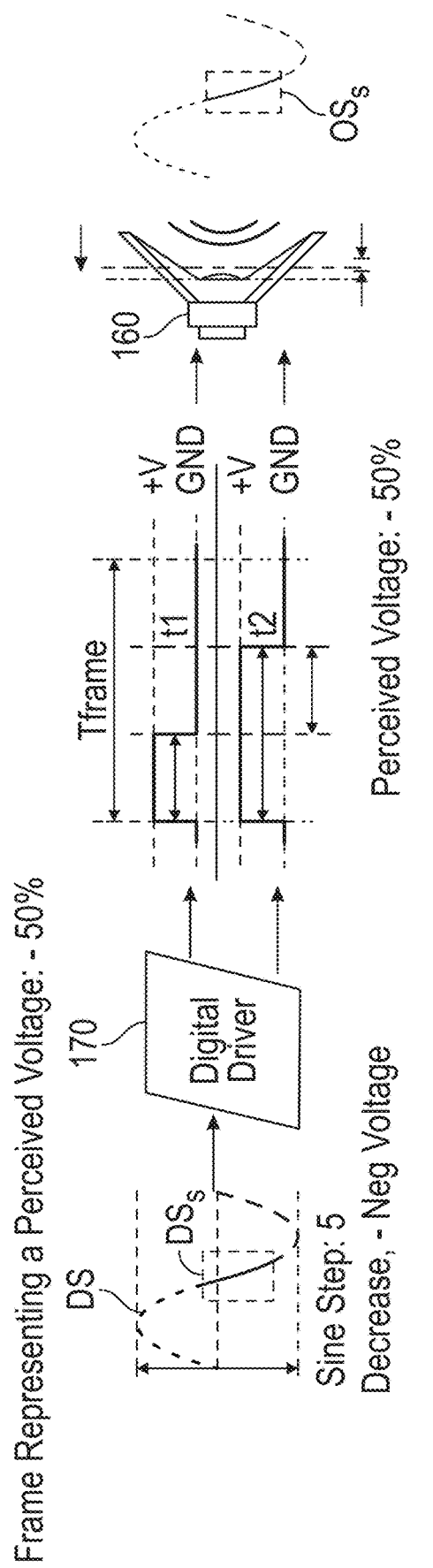
FIG. 4A is a schematic view illustrating a perceived voltage of two digital lines for a negative voltage input of a driving analog signal for the circuit of FIG. 1.
Figure 4B:
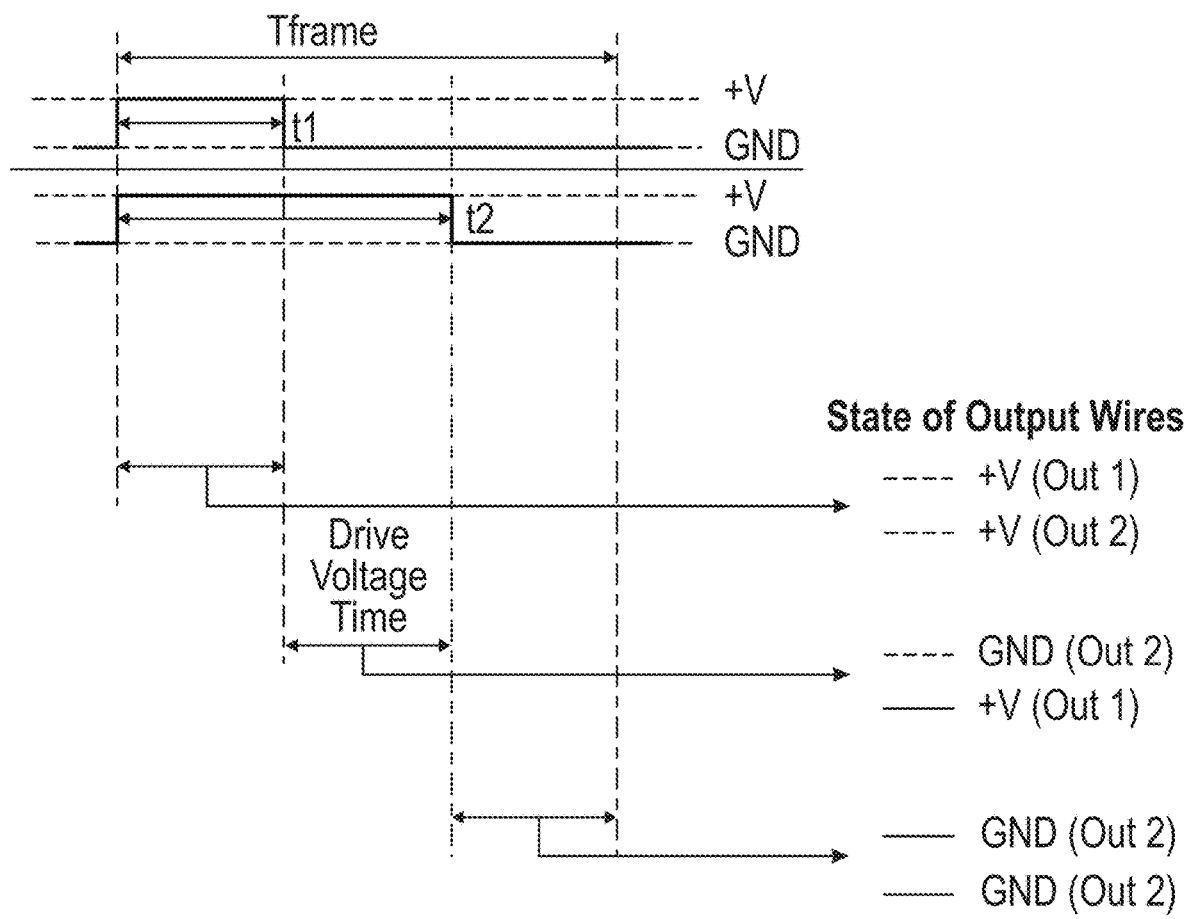
FIG. 4B is an illustrative view showing a state of output lines for the input signal shown in FIG. 4A.

Time: T0 to t2: Output wires both Positive
Time: t2 to t1: Output wire 2 drops from Positive to Ground
Time: t1 to End of Frame: Output wire 1 drops to Ground FIGS. 4A and 4B show the reproduction of a section of a driving signal similar to that shown in FIGS. 3A and 3B, except that the example shows replication for a negative value section of the driving signal. In the example shown in FIG. 4A, the perceived voltage output of negative 50% is produced by having the duration t2 in the high state longer than the duration of t1 in the high state. For example, the first digital signal is dropped to ground before the second digital signal is dropped to ground. With the second digital second being registered by the analog load 160 for duration t2−t1, the resultant output is a negative value pulling the magnetic coil in the other direction within the analog load 160.

FIGS. 5A-5I illustrate the method above by depicting reproduction of a desired output signal from a driving signal for one period of a sine wave (0 to 180 degrees). For purposes of illustration, a sine wave is used so that one can follow the gradual changes of the output signal as the relationship in the duration of each digital signal to the duration of the other digital signal increases and decreases. In reproducing a sine wave, the relationship will be cyclical as the duration of one digital signal moves from being longer than the duration of the other digital signal to being even and then to being less than the duration of the other digital signal. As will be seen, as the duration of one digital signal in the high state is longer, the duration of the second digital signal may become shorter in a sliding scale relationship to generate either a more positive or more negative output. The relationships depicted represent high and low points of a sine wave driving signal along with a zero level and halfway points of the sine wave for ease of understanding. However, it should be understood that the subject method can produce output signals that represent points in the desired output signal that are in between the ones shown. In addition, while an ideal sine wave is used as an example output signal, it should be understood that the control of digital signals can reproduce outputs of varying frequency and amplitude as in music or other non-uniform outputs.

Figure 5A:
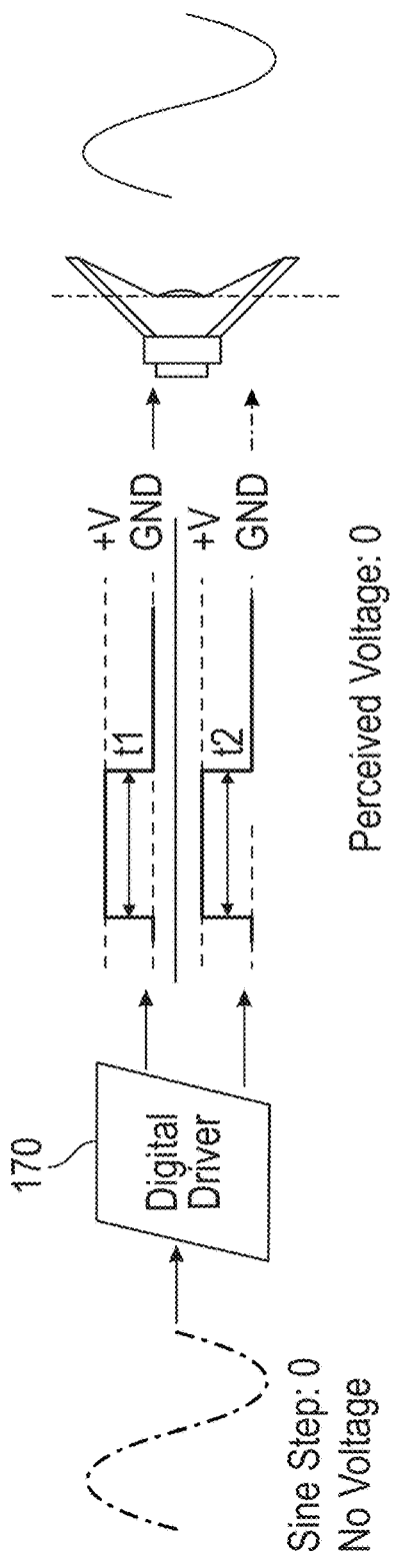

In FIG. 5A, at a first frame, the output represents a signal at the reference or zero level. As is illustrated at the analog load 160, the output shows no displacement of the element driven and is positioned at default as represented by the single vertical dashed line. For the output to be zero, the first digital signal and the second digital signal are both energized to the high state for the same duration (+1=t2).

Figure 5B:
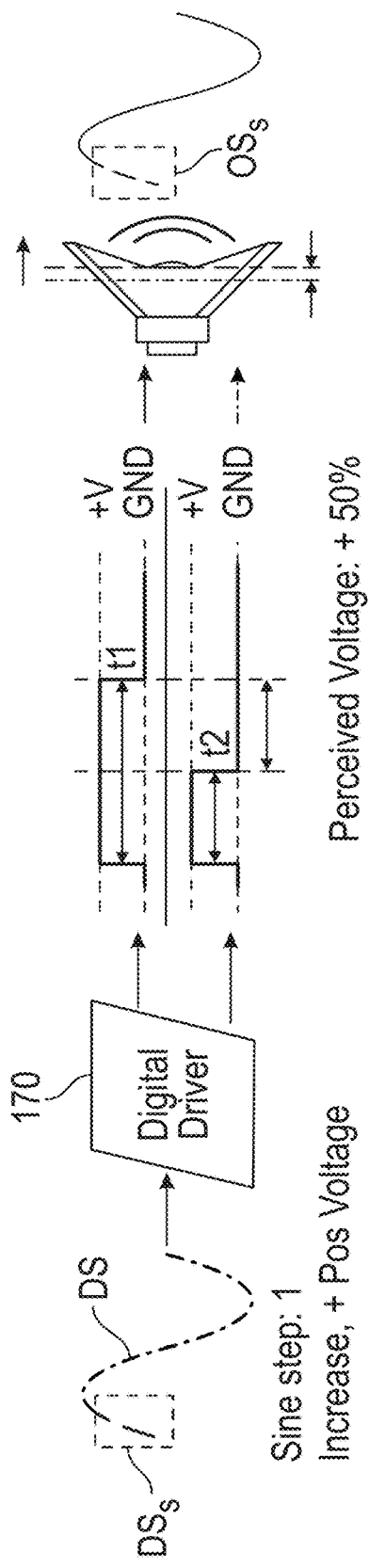

In FIG. 5B, during a second frame, the circuit may output the start of the driving signal's desired section of output $DS_S$, which in this case, the section is a positive signal rising toward the maximum. To reproduce the desired output section of the driving signal, the second digital signal may be pulled down (similar to the example shown in FIGS. 3A and 3B). The analog load 160 registers the perceived voltage as positive and at 50% of the maximum voltage level. Thus, the displacement of the element driven is shown as being pushed out from the default position, however the element is not fully displaced.

In FIG. 5C, as the driving signal reaches the maximum, in the next frame, the second digital signal may be pulled down earlier and the first digital signal may remain in the high state longer, for example, the full length of the frame, so that the perceived voltage output represents 100% of the desired output signal. The result in the analog load 160 is shown physically with the driven element being displaced to its maximum from the default position and the sound output is more than the output shown in FIG. 5B.

In FIG. 5D, as the driving signal cycles down toward the reference level, in the next frame, the first digital signal remains in the high state for less duration than in FIG. 5C (and similar to FIG. 5B). The second digital signal is dropped to the reference level earlier than the first digital signal (similar to the control shown in FIG. 5B).

While the scenarios shown thus far and those that will be shown below appear discrete, it will be understood that there may be more frames in between the sections of the driving signal illustrated. In those intermediate sections, the duration of t1 in the high state and the duration of t2 in the high state may be controlled to increase and decrease proportionally to one another to produce levels in between 0% and 50% and in between 50% and 100%. For example, for positive outputs, the duration of the first digital signal may decrease from the maximum in proportion to the duration of the second signal increasing to produce perceive voltages falling from 100% to 0%. As such, the relationship between the first digital signal and the second digital signal duration in the high state may be considered a sliding scale that is reciprocal on both sides (positive and negative) of a 0 voltage point.

Figure 5E:
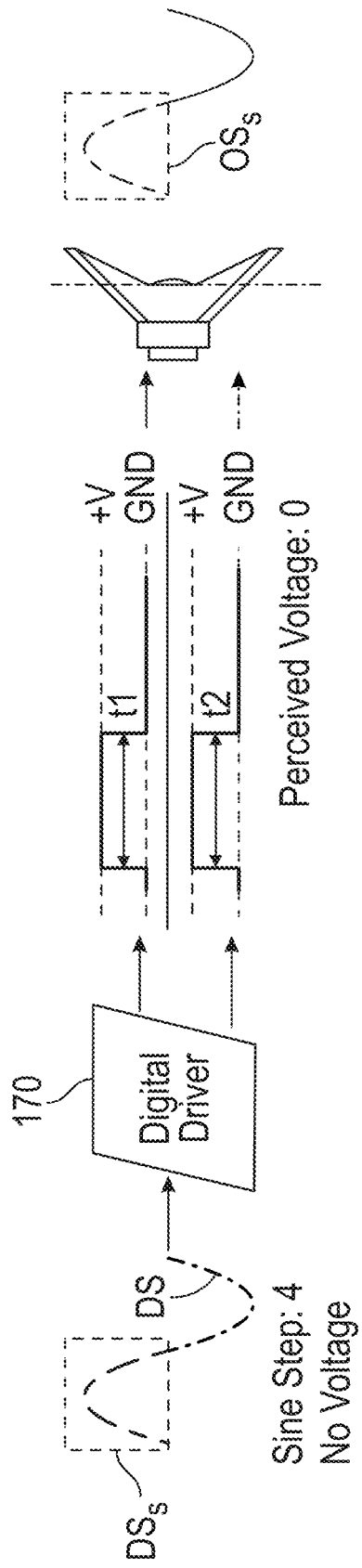

FIG. 5E shows the control of the first and the second digital signal in a next frame, reproducing the desired output from the driving signal returning to the zero level from a positive level. The control parameters driving the first and second digital signals is similar to that shown in FIG. 5A.

Figure 5F:
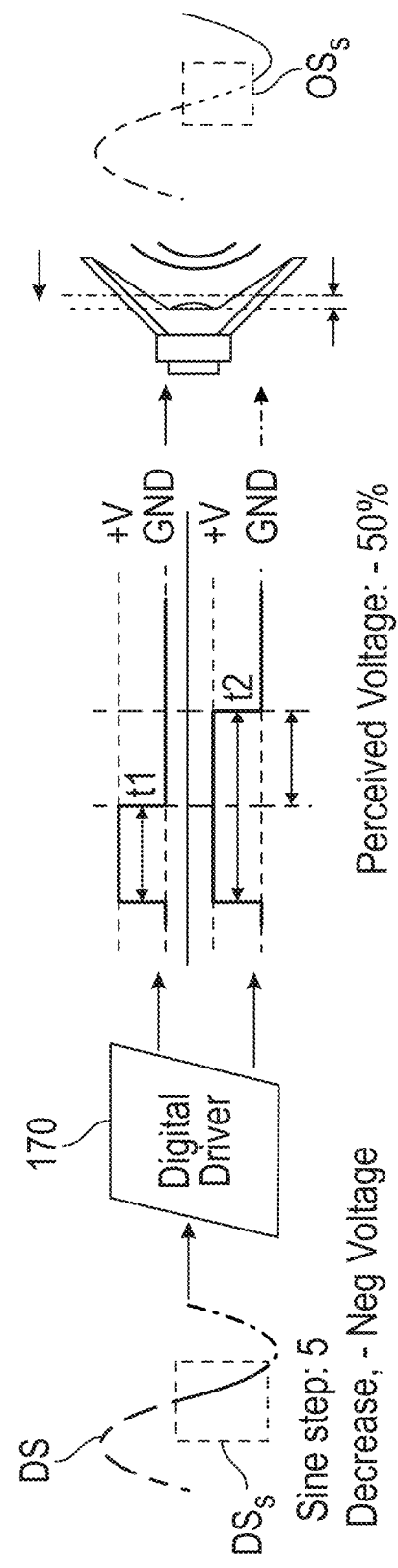

FIG. 5F shows the control of the first and the second digital signal in a next frame, reproducing a desired output signal entering a negative section of the signal. The control of the first digital signal is dropped to the reference level before the second digital signal is dropped to the reference level. Accordingly, the duration t1 is less than the duration t2 within the frame. In FIG. 5F, the perceived voltage is approximately negative 50%. The analog load 160 displaces the driven element in a negative direction, the magnitude of which is represented by the relative spacing of the pair of vertical dashed lines passing through the speaker. As will be seen when compared to the displacement in FIG. 5G, the driven element is only partially displaced between its default position and maximum position.

Figure 5G:
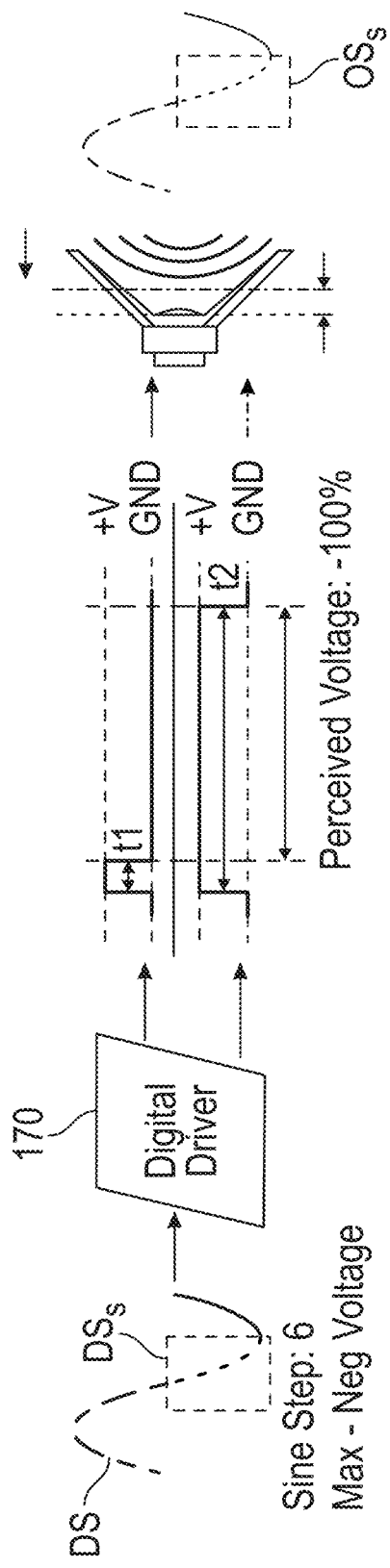

FIG. 5G shows the control of the first and the second digital signal in a next frame, reproducing the desired output signal approaching a maximum negative section of the signal. The first digital signal is dropped to the reference level earlier than when compared to when the first digital signal was dropped in FIG. 5F. In addition, the second digital signal may be maintained in the high state throughout the duration of the frame T. As can be seen, the control of the digital signals mirrors the control parameters shown in FIG. 5C when the driving signal was at its positive maximum, with the digital signal durations reversed. The displacement of the driven element at the analog load 160 is displaced to its maximum in the negative direction (i.e., pulled backward) as the second digital signal dominates the input into the analog load.

Figure 5H:
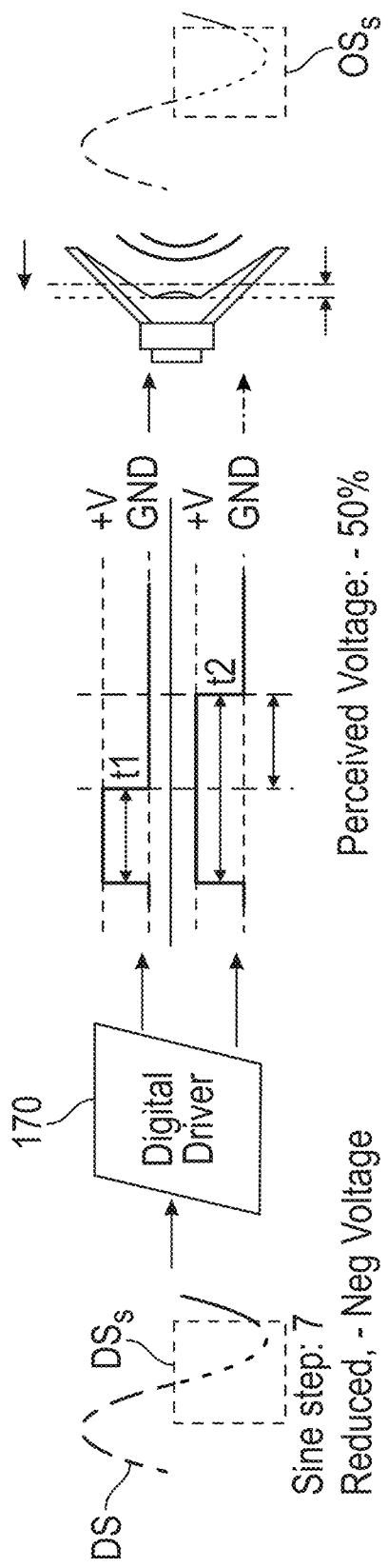
Figure 5I:
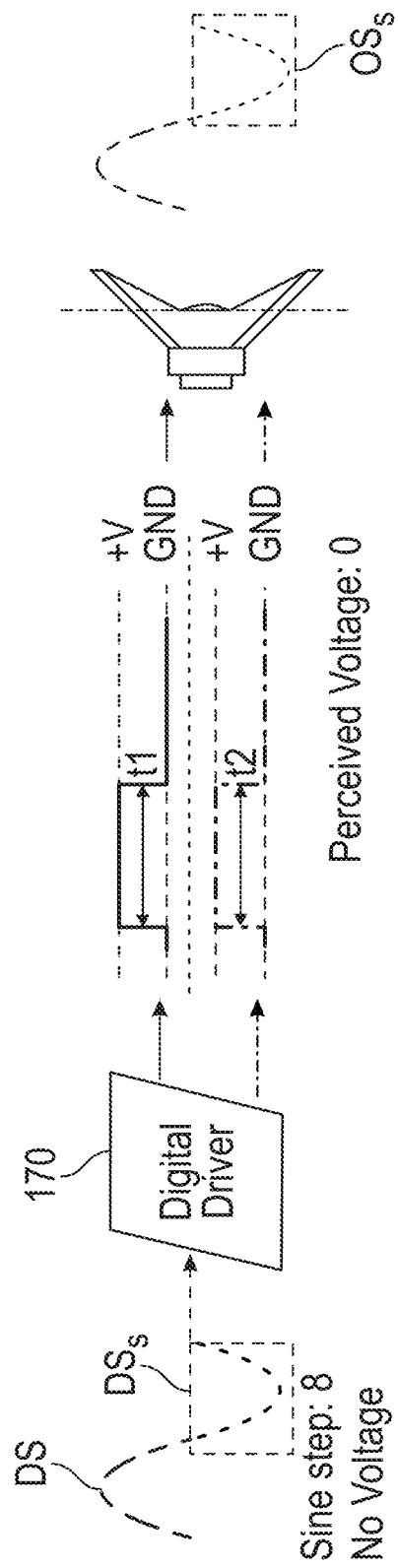

As the driving signal begins to return toward the positive direction, the digital signals begin to shift so that the first digital signal is gradually dropped to the reference level later in the frame. The second digital signal is similarly dropped later in the frame (as depicted in FIG. 5H) displacing the driven element less at the analog load 160, in reproduction of the data coming in from the driving signal. FIG. 5H shows the same control as the point in time in the frame depicted in FIG. 5F. The duration of the digital signals in the high state may gradually approach each other as the driving signal returns to the zero level, which is shown in FIG. 5I.

While the above was illustrated using a sine wave as an example of a driving signal, it should be understood that the control of the first digital signal and the second digital signal are not necessarily linear as depicted. More complex driving signals that do not oscillate uniformly between maximum positive levels and maximum negative levels are contemplated to be replicated. For signals that oscillate non-uniformly (for example, music signals), the first digital signal and the second digital signal may be controlled to replicate the changes of direction in a driving signal by controlling the duration of each digital signal to generate the perceived voltage associated with the value of the driving signal for any given frame.

Those of skill in the art would appreciate that various components and blocks may be arranged differently (e.g., arranged in a different order, or partitioned in a different way) all without departing from the scope of the subject technology. The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects.

Thus, the claims are not intended to be limited to the aspects shown herein, but are to be accorded the full scope consistent with the language of claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A circuit, comprising: a controller; a driving signal source coupled to the controller; a first digital output line coupled between the controller and an analog load, wherein the first digital output line is configured to carry a first digital signal; a second digital output line coupled between the controller and the driving signal source, wherein the second digital output line is configured to carry a second digital signal, and wherein, the controller is configured to reproduce a target output signal defined by data from the driving source, wherein the reproduced target output signal is generated by controlling a combination of the first digital signal and the second digital signal, as an output in the analog load.

2. The circuit of claim 1, wherein the combination of the first digital signal and the second digital signal includes:
    a voltage level of the first digital signal being on for a first duration; and
    a voltage level of the second digital signal being on for a second duration in a reciprocating relationship with the duration of the first digital signal.

3. The circuit of claim 1, wherein the combination of the first digital signal and the second digital signal further includes, for a time frame, the first digital signal being pulled down to an off state for part of the time frame.

4. The circuit of claim 1, wherein the combination of the first digital signal and the second digital signal further includes, for a time frame, the second digital signal being pulled down to an off state for part of the time frame.

5. The circuit of claim 1, wherein the controller is configured to control a perceived voltage input to the analog load by controlling the duration of the first digital signal in an energized state relative to the duration of the second digital signal the energized state.

6. The circuit of claim 1, wherein the controller is configured to reproduce a positive section of the target output signal by maintaining the voltage level of the first digital signal in an energized state for a longer duration than the voltage level of the second digital signal in an energized state.

7. The circuit of claim 1, wherein the controller is configured to reproduce a negative section of the target output signal by maintaining the voltage level of the first digital signal in an energized state for a shorter duration than the voltage level of the second digital signal in an energized state.

8. The circuit of claim 1, further comprising an analog to digital converter coupled to the controller or in the controller.

9. The circuit of claim 1, further comprising a memory device coupled to the controller, wherein the memory device includes instructions configured to control the first digital signal and the second digital signal.

10. The circuit of claim 1, further comprising a gate driver connected between the controller and the analog load.

11. A method of driving an analog load, comprising:
    controlling a voltage level of a first digital signal connected to the analog load between an on state and an off state;
    controlling a voltage level of a second digital signal connected to the analog load between the on state and the off state; and
    controlling a duration of the first digital signal in the on state in a reciprocating relationship with a duration of the second digital signal in the on state, wherein frames of the voltage level of the first digital signal and the voltage level of the second digital signal reproduce a driving signal as output from the analog load.

12. The method of claim 11, further comprising controlling a perceived voltage input to the analog load by controlling the duration of the first digital signal in an energized state relative to the duration of the second digital signal the energized state.

13. The method of claim 11, further comprising reproducing a positive section of the driving signal by maintaining the voltage level of the first digital signal in an energized state for a longer duration than the voltage level of the second digital signal in an energized state.

14. The method of claim 11, further comprising reproducing a positive section of the driving signal by maintaining the voltage level of the first digital signal in an energized state for a shorter duration than the voltage level of the second digital signal in an energized state.

15. The method of claim 11, further comprising converting the driving signal input into the first digital signal and into the second digital signal using an analog to digital converter.

16. A method of driving an analog load, comprising:
receiving a driving signal or file;
generating a first digital signal sent to the analog load;
generating a second digital signal sent to the analog load;
establishing a ground voltage level;
reproducing the driving signal or file as an analog output from the analog load by:
  driving the first digital signal to a voltage state higher than the ground voltage level;
  driving the second digital signal to the voltage state higher than the ground voltage level;
  determining by a controller, a voltage level associated with a section of the driving signal or file; and
  pulling either the first digital signal or the second digital signal to the ground voltage state, for a time frame associated with the section of the driving signal or file.

17. The method of claim 16, further comprising controlling a perceived voltage input to the analog load by controlling a duration of the first digital signal in the voltage state higher than the ground voltage level relative to a duration of the second digital signal in the voltage state higher than the ground voltage level.

18. The method of claim 17, wherein the perceived voltage is a product of a voltage level driving the first digital signal and the second digital signal and a difference in the duration of the first digital signal in the voltage state higher than the ground voltage level relative to the duration of the second digital signal in the voltage state higher than the ground voltage level over a given time frame.

19. The method of claim 16, further comprising reproducing a positive section of the driving signal or file by maintaining the first digital signal in in the voltage state higher than the ground voltage level for a longer duration than the second digital signal being in the voltage state higher than the ground voltage level.

20. The method of claim 16, further comprising reproducing a negative section of the driving signal or file by maintaining the first digital signal in in the voltage state higher than the ground voltage level for a shorter duration than the second digital signal being in the voltage state higher than the ground voltage level.

* * * * *